United States Patent
Murase

(10) Patent No.: US 9,931,937 B2
(45) Date of Patent: Apr. 3, 2018

(54) VEHICLE INSTALLATION STRUCTURE

(71) Applicant: HONDA MOTOR CO., LTD., Tokyo (JP)

(72) Inventor: Hiroyuki Murase, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/182,605

(22) Filed: Jun. 15, 2016

(65) Prior Publication Data
US 2016/0368383 A1 Dec. 22, 2016

(30) Foreign Application Priority Data
Jun. 17, 2015 (JP) .................................. 2015-121825

(51) Int. Cl.
| | | |
|---|---|---|
| B60L 1/02 | (2006.01) | |
| B60L 11/18 | (2006.01) | |
| H05K 7/20 | (2006.01) | |
| B60R 16/02 | (2006.01) | |
| B60R 16/023 | (2006.01) | |

(52) U.S. Cl.
CPC ............. B60L 1/02 (2013.01); B60L 11/1874 (2013.01); B60R 16/0215 (2013.01); B60R 16/0239 (2013.01); H05K 7/20918 (2013.01); B60L 2240/36 (2013.01)

(58) Field of Classification Search
CPC ... B60L 1/02; B60L 11/1824; H05K 7/20918; H02G 3/08; B60R 16/0239

USPC .................... 361/688, 600; 174/50; 165/185; 248/638
See application file for complete search history.

(56) References Cited

U.S. PATENT DOCUMENTS

| | | | | |
|---|---|---|---|---|
| 5,159,738 A | * | 11/1992 | Sunagawa | ............. A47L 9/0081 15/326 |
| 8,717,761 B2 | * | 5/2014 | Aoki | ....................... B60K 1/04 165/104.33 |
| 2007/0000231 A1 | * | 1/2007 | Otsuka | ............... B60H 1/00428 60/203.1 |
| 2012/0031695 A1 | * | 2/2012 | Tsuchiya | .................. B60K 1/04 180/68.5 |

FOREIGN PATENT DOCUMENTS

JP   2007-008403   1/2007

* cited by examiner

*Primary Examiner* — Dion R Ferguson
*Assistant Examiner* — Mandeep S Buttar
(74) *Attorney, Agent, or Firm* — Mori & Ward, LLP

(57) ABSTRACT

A vehicle installation structure includes a vehicle frame and an electrical unit. The electrical unit includes at least one first high-voltage electrical apparatus, a cooling structure, and a bracket. The cooling structure is to cool the at least one first high-voltage electrical apparatus. The cooling structure has a duct member made of a non-metal material. The bracket is attached to the vehicle frame. The at least one first high-voltage electrical apparatus is connected to the bracket via the duct member with a connecting member.

9 Claims, 5 Drawing Sheets

VEHICLE INSTALLATION STRUCTURE

CROSS-REFERENCE TO RELATED APPLICATIONS

The present application claims priority under 35 U.S.C. § 119 to Japanese Patent Application No. 2015-121825, filed Jun. 17, 2015, entitled "Vehicle Installation Structure for Electrical Unit." The contents of this application are incorporated herein by reference in their entirety.

BACKGROUND

1. Field

The present disclosure relates to a vehicle installation structure.

2. Description of the Related Art

For example, an electrically driven vehicle such as a hybrid vehicle or an EV includes plural high-voltage electrical apparatuses such as an inverter that controls a traction motor and a DC-DC converter for voltage control. Because heat generation occurs in those high-voltage electrical apparatuses, a structure is employed in which cooling air is introduced to an electrical unit that includes the high-voltage electrical apparatuses and the high-voltage electrical apparatuses are cooled by heat exchange with the cooling air.

As an example of such a kind of a technique, Japanese Unexamined Patent Application Publication No. 2007-8403 discloses a cooling device for an electrical unit for a vehicle. In this cooling device, the high-voltage electrical apparatuses are mounted on heat dissipating plates.

Further, in a position opposed to the heat dissipating plate on which the inverter is mounted, the heat dissipating plate on which the DC-DC converter is mounted and the heat dissipating plate on which a power converter for driving an auxiliary apparatus are adjacently arranged such that the heat dissipating plate for the DC-DC converter is positioned upstream and the heat dissipating plate for the power converter is positioned downstream. In addition, those opposed heat dissipating plates are coupled together by a side wall member so as to cover a side of heat dissipating fins on a back surface side, and a path of cooling air is thereby formed with those opposed heat dissipating plates and the side wall member. Japanese Unexamined Patent Application Publication No. 2007-8403 discloses that such a configuration enables the manufacturing cost to be reduced and the device to be made compact.

SUMMARY

According to one aspect of the present disclosure, a vehicle installation structure for an electrical unit fixes an electrical unit provided with plural high-voltage electrical apparatuses and a cooling structure for cooling the plural high-voltage electrical apparatuses to a vehicle frame via a bracket. The cooling structure has a duct member that is made of a non-metal material, and at least one high-voltage electrical apparatus among the plural high-voltage electrical apparatuses is integrally fastened to the bracket together with the duct member by a same connecting member.

According to another aspect of the present disclosure, a vehicle installation structure includes a vehicle frame and an electrical unit. The electrical unit includes at least one first high-voltage electrical apparatus, a cooling structure, and a bracket. The cooling structure is to cool the at least one first high-voltage electrical apparatus. The cooling structure has a duct member made of a non-metal material. The bracket is attached to the vehicle frame. The at least one first high-voltage electrical apparatus is connected to the bracket via the duct member with a connecting member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
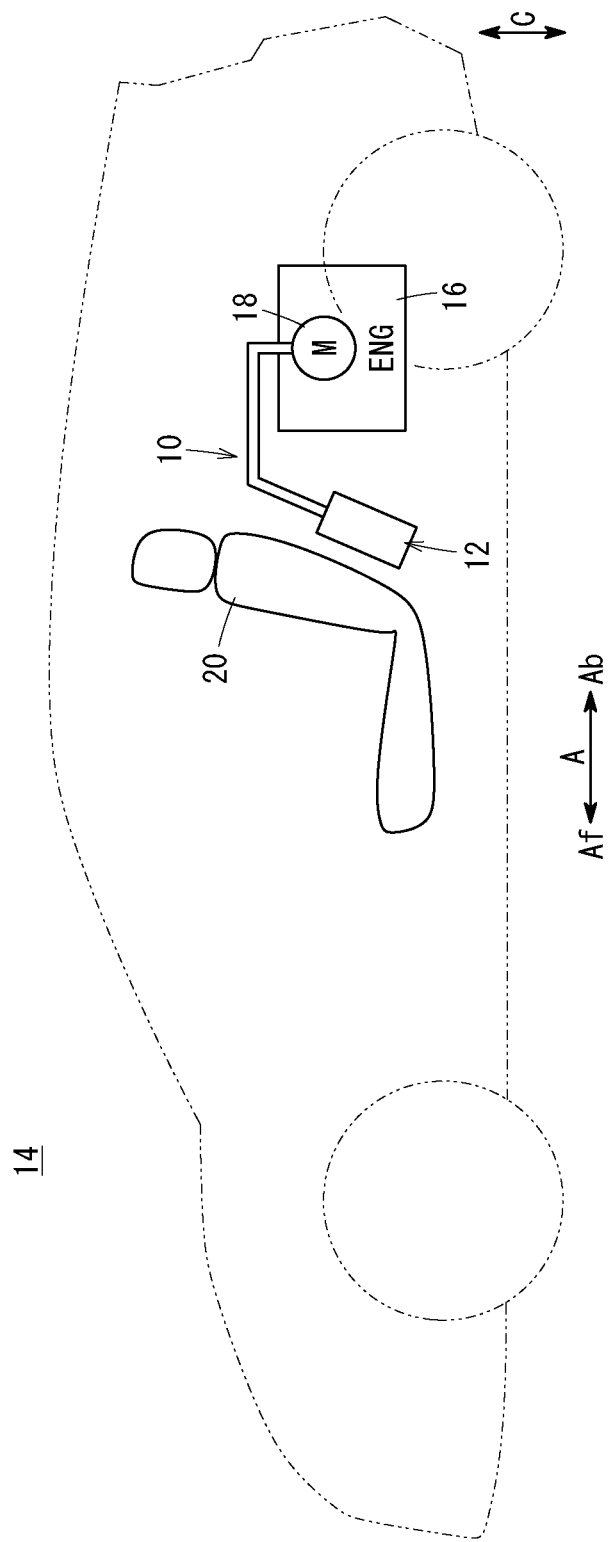
FIG. 1 is a schematic side view of an electrically driven vehicle in which a vehicle installation structure according to an embodiment of the present disclosure is built.

The embodiments will now be described with reference to the accompanying drawings, wherein like reference numerals designate corresponding or identical elements throughout the various drawings.

As illustrated in FIG. 1, in a vehicle installation structure 10 according to an embodiment of the present disclosure, an electrical unit 12 is installed in an electrically driven vehicle 14.

The electrically driven vehicle 14 is a hybrid vehicle, an EV, or the like, for example. An engine 16 and a motor 18 are coupled together. The engine 16 and the motor 18 are provided in the rear of a seat 20 (in the arrow Ab direction) (in the rear in the arrow A direction that is the vehicle longitudinal direction) but may be provided in a front box in the front in the vehicle longitudinal direction (in the arrow Af direction). The motor 18 is a three-phase DC brushless motor, for example.

Figure 2:
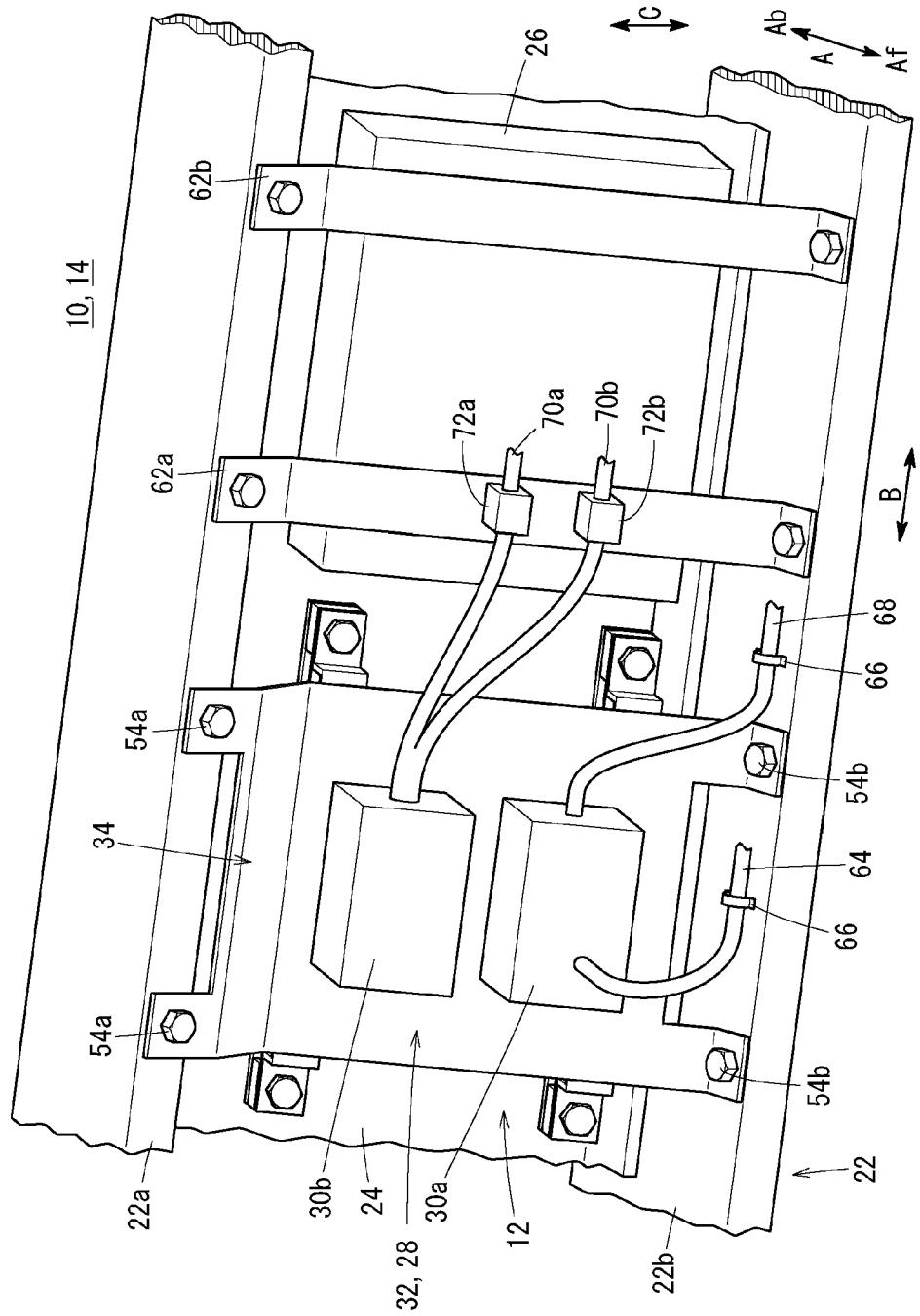
FIG. 2 is a perspective explanation diagram of the vehicle installation structure.
Figure 3:
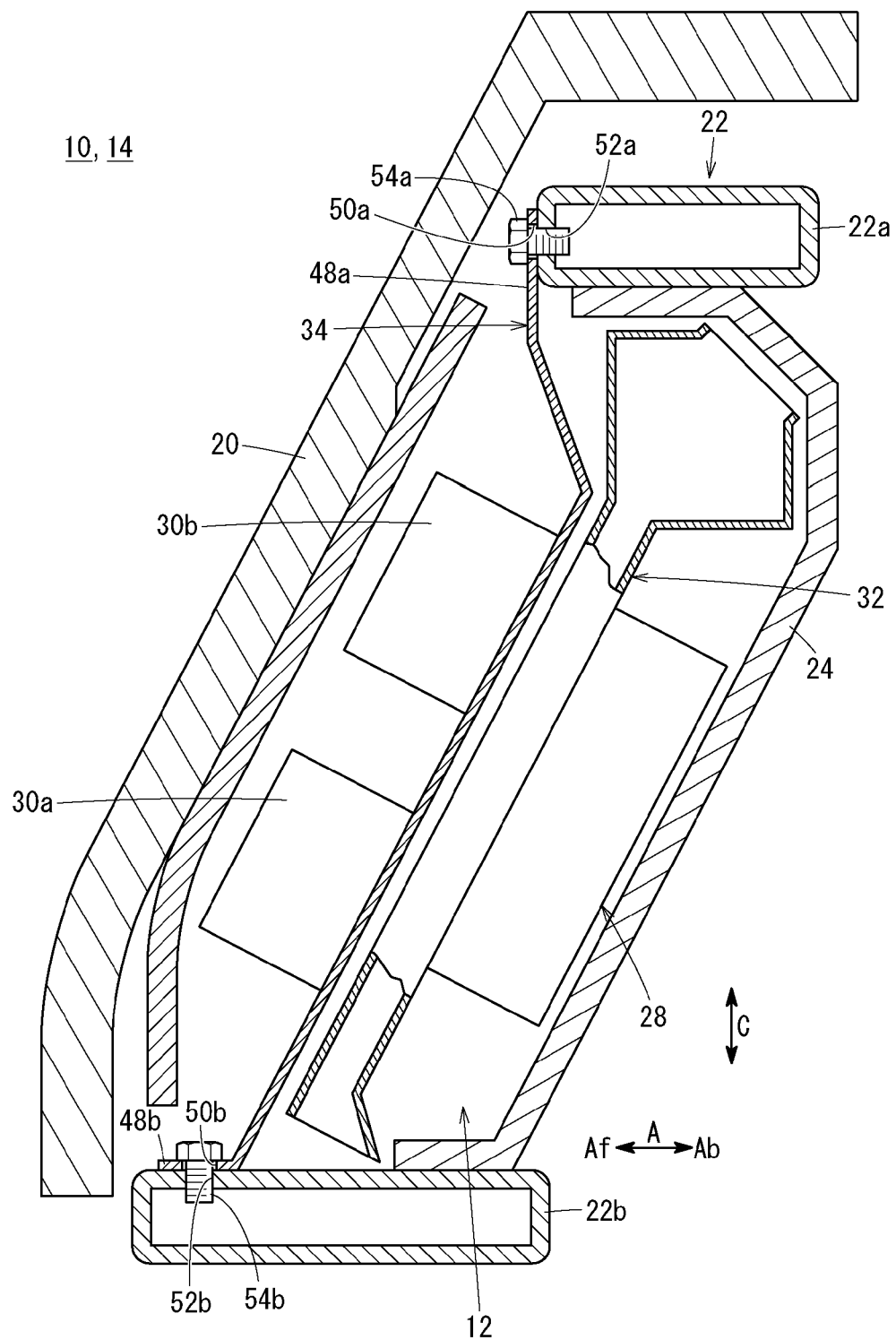
FIG. 3 is a cross-sectional side view of the vehicle installation structure.

As illustrated in FIGS. 2 and 3, the electrically driven vehicle 14 is provided with a vehicle frame 22 in the rear of the seat 20. The vehicle frame 22 has an upper frame 22a and a lower frame 22b, each of which extends in the vehicle width direction (the arrow B direction in FIG. 2). An electrical component box 24 is arranged between the upper frame 22a and the lower frame 22b. The electrical component box 24 houses the electrical unit 12 and a battery module 26 (see FIG. 2). The electrical component box 24 is employed as needed and may not have to be used.

Figure 4:
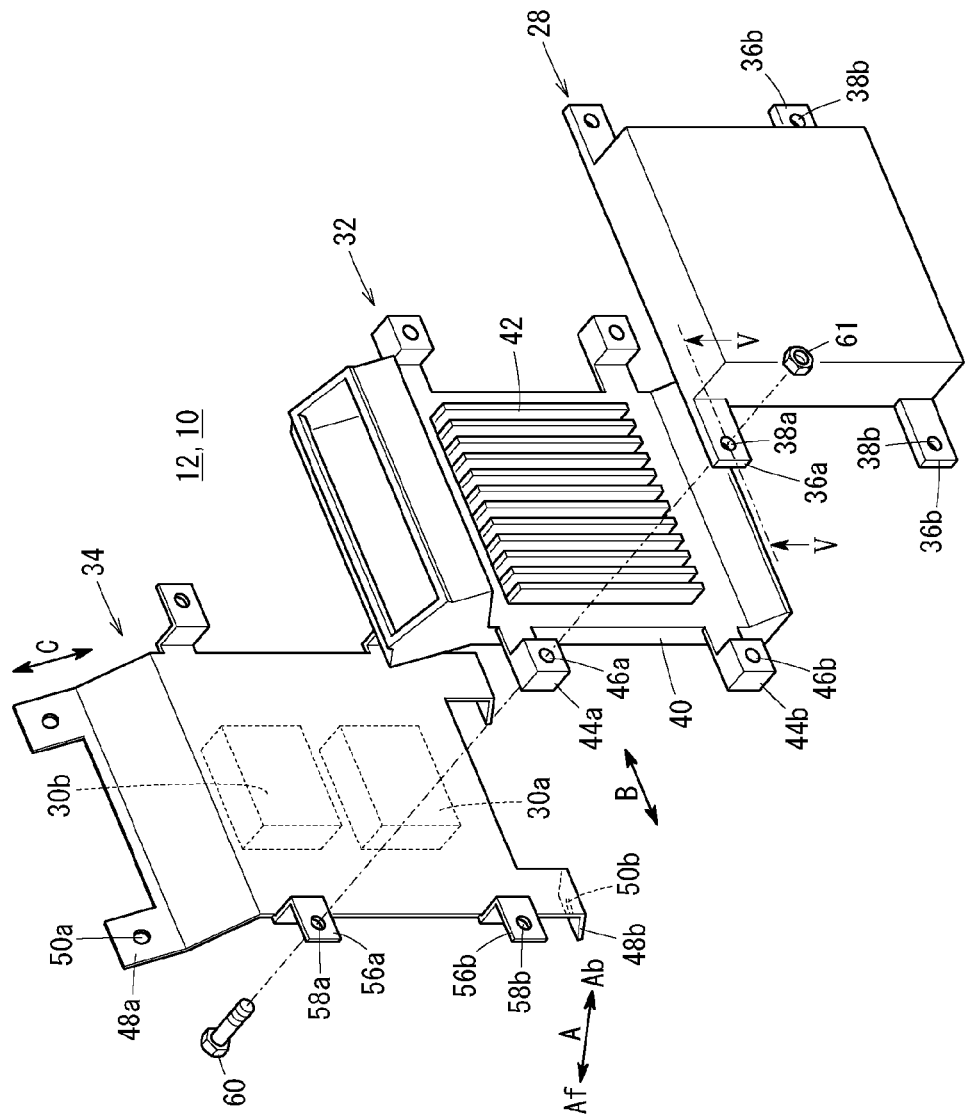
FIG. 4 is a perspective explanation diagram of the vehicle installation structure, in which principal components are exploded.

As illustrated in FIGS. 3 and 4, the electrical unit 12 includes plural high-voltage electrical apparatuses such as a DC-DC converter 28 (a first high-voltage electrical apparatus) and junction boxes (junction boards) 30a and 30b (second high-voltage electrical apparatuses), for example, and high-voltage electrical apparatuses in addition, which are not illustrated. The electrical unit 12 is provided with a cooling structure 32 and is fixed to the vehicle frame 22 via a bracket 34 (see FIGS. 2 and 3). In the electrical unit 12, the junction boxes 30a and 30b, the bracket 34, the cooling structure 32, and the DC-DC converter 28 are arranged rearward from the seat 20 side (in the arrow Ab direction) in this order (see FIG. 3).

As illustrated in FIG. 4, mount portions 36a and 36b are formed to swell out at both ends of the DC-DC converter 28 in the vehicle width direction (the arrow B direction). The mount portions 36a and 36b are in plate shapes and are respectively provided with hole portions 38a and 38b.

The cooling structure 32 has a duct member 40 that is made of a non-metal material, for example, a resin material. The DC-DC converter 28 is provided with plural cooling fins 42. The cooling fins 42 are arranged in the duct member 40. Mount portions 44a and 44b are formed to swell out at both ends of the duct member 40 in the vehicle width direction (the arrow B direction). The mount portions 44a and 44b are in block shapes and are respectively provided with hole portions 46a and 46b.

The bracket 34 is in a plate shape, and a pair of upper side fixing portions 48a is formed in upper portions of the bracket 34. The upper side fixing portion 48a is inclined forward at a relatively small angle and is provided with a hole portion 50a. A pair of lower side fixing portions 48b is formed in lower portions of the bracket 34. The lower side fixing portion 48b is inclined forward at a relatively large angle and is provided with a hole portion 50b.

As illustrated in FIG. 3, in the upper frame 22a, a pair of threaded holes 52a is formed coaxially with the pair of the hole portions 50a and to be directed in the horizontal direction. In the lower frame 22b, a pair of threaded holes 52b is formed coaxially with the pair of the hole portions 50b and to be directed in the vertical direction.

Screws 54a and 54b are inserted in the hole portions 50a and 50b and respectively screwed with the threaded holes 52a and 52b, and the bracket 34 is thereby fixed to the vehicle frame 22. In a case where the bracket 34 is fixed to the vehicle frame 22, the upper side fixing portions 48a are arranged to be parallel with the horizontal direction (the arrow A direction), and the lower side fixing portions 48b are arranged to be parallel with the vertical direction (the arrow C direction).

Figure 5:
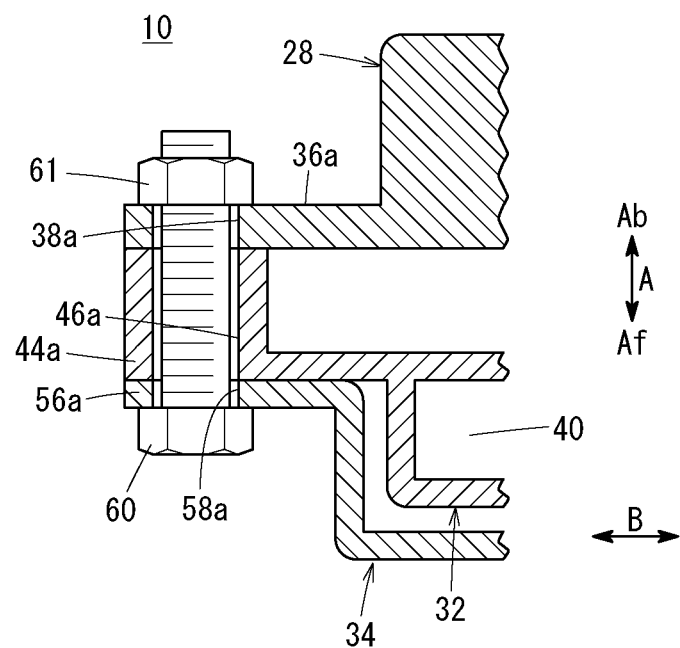
FIG. 5 is a cross-sectional view of the vehicle installation structure, which is taken along line V-V in FIG. 4.

As illustrated in FIG. 4, mount portions 56a and 56b are formed to swell out at both ends of the bracket 34 in the vehicle width direction (the arrow B direction). The mount portions 56a and 56b are in plate shapes and are respectively provided with hole portions 58a and 58b. As illustrated in FIGS. 4 and 5, two fixing bolts (connecting members) 60 are inserted in the hole portions 58a, 46a, and 38a, and nuts 61 are screwed with ends of the fixing bolts 60. The two other fixing bolts (connecting members) 60 are inserted in the hole portions 58b, 46b, and 38b, and the nuts 61 are screwed with ends of the fixing bolts 60. The DC-DC converter 28 is integrally fastened to the bracket 34 together with the duct member 40 by the same fixing bolts 60.

As illustrated in FIG. 2, the battery module 26 is fastened by the screws to the upper frame 22a and the lower frame 22b via bracket members 62a and 62b and is thereby fixed to the vehicle frame 22. The battery module 26 is configured by laminating high-voltage batteries.

The junction box 30a is provided with a DC cable (first power line) 64 that is connected with the DC-DC converter 28 and an inverter (another electrical apparatus), which is not illustrated. The DC cable 64 is fixed to the lower frame 22b, to which the bracket 34 is fixed, via a cable tie (fixing point) 66. The junction box 30a is provided with a cable (second power line) 68, which is connected with an air conditioner and so forth, which are not illustrated. The cable 68 is fixed to the lower frame 22b via the cable tie 66. Various connecting members may be used instead of the cable tie 66.

The junction box 30b is provided with battery cables (second power lines) 70a and 70b that are connected with the battery module 26. The battery cables 70a and 70b are fixed to the bracket member 62a that is fixed to the vehicle frame 22 via fixing members (fixing points) 72a and 72b. The fixing members 72a and 72b may be cable ties or connectors.

As illustrated in FIGS. 4 and 5, in the vehicle installation structure 10 configured as described above, at least one high-voltage electrical apparatus, for example, the DC-DC converter 28 is integrally fastened to the bracket 34 together with the duct member 40 by the same fixing bolts 60.

Specifically, the fixing bolts 60 and 60 are integrally inserted in the hole portions 58a and 58b of the bracket 34, the hole portions 46a and 46b of the duct member 40, and the hole portions 38a and 38b of the DC-DC converter 28. Further, the nuts 61 are screwed with the ends of the fixing bolts 60, and thereby the DC-DC converter 28 is integrally fastened to the bracket 34 together with the duct member 40. Accordingly, individual connecting members do not have to be used in order to fix the DC-DC converter 28 and the duct member 40 to the bracket 34.

In addition, the duct member 40 is made of a non-metal material, for example, a resin material. Because the duct member 40 itself has a vibration control function, a separate vibration control member does not have to be provided. Accordingly, the vehicle installation structure 10 provides effects of effectively reducing the number of components and of enabling vibration control for the high-voltage electrical apparatuses to be properly performed in an economical and compact configuration.

Further, in this embodiment, as illustrated in FIG. 2, the DC cable 64 provided to the junction box 30a is fixed to the lower frame 22b, to which the bracket 34 is fixed, via the cable tie (fixing point) 66. In addition, the cable 68 provided to the junction box 30a is fixed to the lower frame 22b via the cable tie 66. Furthermore, the battery cables 70a and 70b that are provided to the junction box 30b are fixed to the bracket member 62a via the fixing members 72a and 72b.

Thus, the DC cable 64, the cable 68, the battery cables 70a and 70b, and so forth have fixing points with respect to the vehicle frame 22 and may function as damping elements. This provides advantages of reducing input vibrations to electrical apparatuses (including the high-voltage electrical apparatuses) and of enabling vibration resistance to be properly improved in a simple configuration.

A vehicle installation structure of an electrical unit, the vehicle installation structure according to the present disclosure, fixes an electrical unit provided with plural high-voltage electrical apparatuses and a cooling structure for cooling the plural high-voltage electrical apparatuses to a vehicle frame via a bracket. The cooling structure has a duct member that is made of a non-metal material, and at least one high-voltage electrical apparatus among the plural high-voltage electrical apparatuses is integrally fastened to the bracket together with the duct member by a same connecting member.

Further, the electrical unit is preferably provided with a DC-DC converter and a junction box that are the high-voltage electrical apparatuses. In such a case, the DC-DC converter is preferably integrally fastened to one surface side of the bracket together with the duct member, and the junction box is preferably fixed to another surface side of the bracket.

In addition, a first power line that is connected with the DC-DC converter and another electrical apparatus and a second power line that is connected with the junction box and still another electrical apparatus are provided with respective fixing points in the vehicle frame to which the bracket is fixed.

In the present disclosure, at least one of the high-voltage electrical apparatuses is integrally fastened to the bracket together with the duct member by the same connecting member. Accordingly, individual connecting members do not have to be used in order to fix the high-voltage electrical apparatus and the duct member to the bracket.

Further, the duct member is made of a non-metal material. Because the duct member itself has a vibration control function, a separate vibration control member does not have to be provided. Consequently, the number of components is effectively reduced, and vibration control for the high-voltage electrical apparatuses may properly be performed in an economical and compact configuration.

Obviously, numerous modifications and variations of the present invention are possible in light of the above teachings. It is therefore to be understood that within the scope of the appended claims, the invention may be practiced otherwise than as specifically described herein.

What is claimed is:

1. A vehicle installation structure for fixing an electrical unit provided with plural high-voltage electrical apparatuses and a cooling structure for cooling the plural high-voltage electrical apparatuses to a vehicle frame via a bracket, wherein the cooling structure has a duct member that is made of a non-metal material, and at least one high-voltage electrical apparatus among the plural high-voltage electrical apparatuses is integrally fastened to the bracket together with the duct member by a same connecting member, and a mount portion of the duct member has a block shape; and wherein the connecting member extends through a first hole portion on the at least one high-voltage electrical apparatus, a second hole portion on the mount portion of the duct member, and a third hole portion on the bracket.

2. The vehicle installation structure according to claim 1, wherein
the electrical unit is provided with a DC-DC converter and a junction box that are the high-voltage electrical apparatuses,
the DC-DC converter is integrally fastened to one surface side of the bracket together with the duct member, and
the junction box is fixed to another surface side of the bracket.

3. The vehicle installation structure according to claim 2, wherein
a first power line and a second power line are provided with respective fixing points in the vehicle frame to which the bracket is fixed,
the first power line is connected with the DC-DC converter and another electrical apparatus, and
the second power line is connected with the junction box and a further electrical apparatus.

4. The vehicle installation structure according to claim 1, wherein the connecting member is a fixing bolt that extends through the first hole portion on the at least one first high-voltage electrical apparatus, the second hole portion on the mount portion of the duct member, and the third hole portion on the bracket.

5. A vehicle installation structure comprising: a vehicle frame; and an electrical unit comprising: at least one first high-voltage electrical apparatus; a cooling structure to cool the at least one first high-voltage electrical apparatus, the cooling structure having a duct member made of a non-metal material; and a bracket attached to the vehicle frame, the at least one first high-voltage electrical apparatus being connected to the bracket via the duct member with a connecting member, and a mount portion of the duct member has a block shape; and wherein the connecting member extending through a first hole portion on the at least one first high-voltage electrical apparatus, a second hole portion on the mount portion of the duct member, and a third hole portion on the bracket.

6. The vehicle installation structure according to claim 5, wherein
the bracket has a first surface facing the duct member and a second surface opposite to the first surface, and
the electrical unit further comprises at least one second high-voltage electrical apparatus attached to the second surface.

7. The vehicle installation structure according to claim 6, wherein
the at least one first high-voltage electrical apparatus includes a DC-DC converter, and
the at least one second high-voltage electrical apparatus includes a junction box.

8. The vehicle installation structure according to claim 7, wherein
a first power line and a second power line are provided with respective fixing points in the vehicle frame to which the bracket is fixed,
the first power line is connected with the DC-DC converter and another electrical apparatus, and
the second power line is connected with the junction box and a further electrical apparatus.

9. The vehicle installation structure according to claim 5, wherein the connecting member is a fixing bolt that extends through the first hole portion on the at least one first high-voltage electrical apparatus, the second hole portion on the mount portion of the duct member, and the third hole portion on the bracket.

* * * * *